United States Patent
Sugawara et al.

(10) Patent No.: US 7,381,782 B2
(45) Date of Patent: *Jun. 3, 2008

(54) POLYMERIZABLE COMPOSITION AND MOLDED ARTICLES PRODUCED BY USING THE SAME

(75) Inventors: Tomoo Sugawara, Tokyo (JP); Hirotoshi Tanimoto, Tokyo (JP)

(73) Assignee: Zeon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/567,967

(22) PCT Filed: Aug. 13, 2004

(86) PCT No.: PCT/JP2004/011941

§ 371 (c)(1),
(2), (4) Date: Feb. 10, 2006

(87) PCT Pub. No.: WO2005/016991

PCT Pub. Date: Feb. 24, 2005

(65) Prior Publication Data

US 2006/0258828 A1  Nov. 16, 2006

(30) Foreign Application Priority Data

Aug. 13, 2003  (JP) ............................. 2003-292775

(51) Int. Cl.
*C08G 61/08* (2006.01)
*C08F 2/38* (2006.01)

(52) U.S. Cl. .................. 526/308; 526/282; 427/385.5; 428/396; 264/236; 264/331.15; 264/331.17

(58) Field of Classification Search ................ 526/282, 526/308; 427/385.5; 428/396; 264/236, 264/331.15, 331.5, 331.17
See application file for complete search history.

(56) References Cited

U.S. PATENT DOCUMENTS

| 5,204,427 A | | 4/1993 | Torii et al. |
| 5,274,026 A | * | 12/1993 | Benedikt et al. ............ 524/553 |
| 5,728,785 A | * | 3/1998 | Grubbs et al. .............. 526/142 |
| 6,020,443 A | * | 2/2000 | Woodson et al. ........... 526/135 |
| 7,025,851 B2 | * | 4/2006 | Caster et al. ............ 156/306.9 |

FOREIGN PATENT DOCUMENTS

| EP | 0423521 | * | 4/1991 |
| JP | 1-204924 A | | 8/1989 |
| JP | 3-115428 A | | 5/1991 |
| JP | 3-146516 A | | 6/1991 |
| JP | 5-209128 A | | 8/1993 |
| JP | 06-248164 A | | 9/1994 |
| JP | 11-507962 A | | 7/1999 |
| WO | WO-98/05715 A1 | | 2/1998 |

* cited by examiner

*Primary Examiner*—Fred Teskin
(74) *Attorney, Agent, or Firm*—Birch, Stewart, Kolasch & Birch, LLP

(57) ABSTRACT

The present invention provides a polymerizable composition and a resin formed object capable of providing a crosslinked cycloolefin resin formed object and a crosslinked cycloolefin resin composite excellent in heat resistance, more specifically, a polymerizable composition comprising a cycloolefin mixture containing 0.1 to 50 % by mole of a cycloolefin having, as a substituent group, a monovalent group including an aliphatic carbon-carbon unsaturated bond, a metathesis polymerization catalyst, and a radical generating agent; and formed objects produced by using a polymerizable composition described above which preferably further comprises a chain transfer agent and making the cycloolefin mixture undergo at least ring-opening polymenzation.

10 Claims, No Drawings

POLYMERIZABLE COMPOSITION AND MOLDED ARTICLES PRODUCED BY USING THE SAME

TECHNICAL FIELD

The invention relates to a polymerizable composition containing cycloolefin and a resin formed object produced by using the same, and in particular, to a polymerizable composition and a resin formed object that can provide a crosslinked resin formed object and a crosslinked resin composite produced with cycloolefin resin excellent in heat resistance.

BACKGROUND ART

It has been known that a crosslinked resin formed object is obtained by crosslinking, with a crosslinking agent such as an organic peroxide or the like, a cycloolefin resin obtained by ring-opening polymerizing a cycloolefin such as norbornene in the presence of a metathesis polymerization catalyst. It is known that the crosslinked resin formed object is excellent in electric characteristics such as a low dielectric constant and a low dielectric loss tangent in addition to a mechanical strength and a chemical resistance. Focusing on these characteristics, a film-shaped resin formed object has been manufactured, for example, by casting a solution obtained by dissolving a cycloolefin polymer and a crosslinking agent into a solvent onto a flat plate, and then evaporating the solvent by heat at the same time crosslinking. Further, a proposal that the film-shaped resin formed object obtained is laminated with a substrate for printed wiring board or the like to produce a crosslinked resin composite used for electronic parts has been suggested. In Japanese Patent Application Laid-Open No. 6-248164, disclosed are: a film obtained by casting a norbornene resin composition obtained by dissolving a thermoplastic hydrogenated ring-opening norbornene resin, an organic peroxide and a crosslinking agent into a solvent onto a supporting body and then drying; and a crosslinked resin composite obtained by pressing, heating and crosslinking the laminate of a copper foil and a prepreg obtained by impregnating a fiber reinforcement with the above norbornene resin composition and then drying. However, the crosslinked resin composite obtained by above method does not have a sufficient heat resistance enough to produce electronic parts by using a lead-free solder that has been adopted as an environmental protection. Further, there is a problem that the process is complicated because it is necessary to remove a solvent to obtain a film-shaped crosslinked resin formed object. To solve the problem, in Japanese Patent Application National Publication No. 11-507962, proposed is a method for obtaining a crosslinked resin by producing a cycloolefin polymer by ring-opening polymerizing a cycloolefin without a solvent in the presence of a ruthenium carbene complex and a peroxide, and then conducting post-curing (or post-crosslinking).

DISCLOSURE OF INVENTION

As a result of studies having been conducted by the present inventor, it has been found that a crosslinked resin obtained by the method described in Japanese Patent Application National Publication No. 11-507962 does not have a sufficient heat resistance in some case.

Accordingly, it is an object of the present invention, which has been made in light of the problems of the conventional technology, to provide a polymerizable composition and a resin formed object capable of providing a crosslinked cycloolefin resin formed object and a crosslinked cycloolefin resin composite excellent in heat resistance.

The present inventor has repeated extensive researches in order to solve the above problems so as to find out that the heat resistance of a resin formed object, a crosslinked resin formed object and a crosslinked resin composite obtained can be improved by controlling a kind and an amount of crosslinking sites which react with a radial generator in a ring-opening polymer of cycloolefin. Besides, the present inventor has found that the object is achieved by using a cycloolefin with a specific chemical structure in a specific ratio together with a metathesis polymerization catalyst and a radical generating agent. Based on such findings and knowledge, the invention has been completed.

According to this invention, the following first to eighth aspects thereof will be provided.

1. A polymerizable composition comprising: a cycloolefin mixture containing 0.1 to 50% by mole of a cycloolefin having, as a substituent group, a monovalent group including an aliphatic carbon-carbon unsaturated bond, a metathesis polymerization catalyst and a radical generating agent.
2. The polymerizable composition according to above 1, further comprising a chain transfer agent.
3. A resin formed object obtained by ring-opening polymerizing the polymerizable composition as in above 1 or 2.
4. A resin formed object obtained by applying the polymerizable composition as in above 1 on a supporting body, followed by ring-opening polymerizing the polymerizable composition applied.
5. A resin formed object obtained by injecting the polymerizable composition as in above 1 into a cavity of a mold, followed by ring-opening polymerizing the polymerizable composition injected.
6. A resin formed object obtained by impregnating a fiber reinforcement with the polymerizable composition as in above 1, followed by ring-opening polymerizing the polymerizable composition impregnated.
7. A crosslinked resin formed object obtained by heating and crosslinking the resin formed object as in above 3 to the temperature higher than the peak temperature during the ring-opening polymerization.
8. A crosslinked resin composite obtained by laminating the resin formed object as in above 3 with a base material, followed by heating and crosslinking the laminate.

The present invention provides a polymerizable composition and a resin formed object capable of providing a crosslinked cycloolefin resin formed object and a crosslinked cycloolefin resin composite excellent in heat resistance.

BEST MODE FOR CARRYING OUT THE INVENTION

A polymerizable composition of this invention comprises; a cycloolefin mixture containing 0.1 to 50% by mole of a cycloolefin having, as a substituent group, a monovalent group including an aliphatic carbon-carbon unsaturated bond (the cycloolefin is also hereafter referred to as a "specific cycloolefin"), a metathesis polymerization catalyst and a radical generating agent.

The specific cycloolefin used in this invention is the cycloolefin in which, as a substituent group, a monovalent group including an aliphatic carbon-carbon unsaturated bond is bonded to a monocyclic or polycyclic aliphatic hydrocarbon having a carbon-carbon double bond in the ring.

Any monovalent groups each including an aliphatic carbon-carbon unsaturated bond can be used as far as they have an aliphatic carbon-carbon unsaturated bond. The monovalent group has usually 2 to 30 carbon atoms and preferably 2 to 20 carbon atoms. The unsaturated bond is preferably a carbon-carbon double bond. Besides, the carbon-carbon unsaturated bond preferably exists in an a cyclic hydrocarbon group. Further, the carbon-carbon unsaturated bond preferably exists at the terminal of the atomic group. The monovalent group including an aliphatic carbon-carbon unsaturated bond may have a substituent group including a heteroatom.

Examples of the monovalent group including an aliphatic carbon-carbon unsaturated bond include a vinyl group, an allyl group, an acryloyl group, a methacryloyl group, a vinyloxy group, an allyloxy group, a vinyloxycarbonyl group, an allyloxycarbonyl group, an acryloxymethyl group, a methacryloxymethyl group, a vinylphenyl group, a propenoxycarbonylphenyloxycarbonyl group and the like.

The specific cycloolefin is incorporated to a polymer by ring-opening metathesis polymerization of the cycloolefin ring thereof. When the crosslinking reaction is conducted in the polymers by a radical generating agent described later, the unsaturated bond portion of the atomic group in the polymer acts as a crosslinking point and the crosslinking reaction proceeds. Therefore, a crosslinked resin formed object with a high crosslinking density can be formed.

The cycloolefin mixture usually contains the specific cycloolefin in the range of 0.1 to 50% by mole, preferably 0.5 to 40% by mole and more preferably 1 to 30% by mole. When the amount of the specific cycloolefin is too small, the crosslinking density may lower and thus sufficient heat resistance cannot be obtained, while when the amount of the specific cycloolefin is too large, mechanical properties of the resin formed object may lower.

Examples of the specific cycloolefin include monocycloolefin compounds such as 3-vinyl-1-cyclobutene, 3-vinyl-1-cyclopentene, 3-vinyl-1-cyclohexene, 4-vinyl-1-cyclohexene, 3-methyl-5-vinyl-1-cyclohexene, allyl 3-cyclohexene-1-carboxylate, vinyl 3-cyclohexene-1-carboxylate and allyl 1-methyl-3-cyclohexene-1-carboxylate;

bicycloolefin compounds such as 5-vinyl-2-norbornene, 5-(2-propenyl)-2-norbornene, 5-(3-butenyl)-2-norbornene, 5-(4-pentenyl)-2-norbornene, 5,6-divinyl-2-norbornene, 5-methyl-6-vinyl-2-norbornene, 5-vinyloxy-2-norbornene, 5-vinyloxymethyl-2-norbornene, 5-allyloxy-2-norbornene, 5-allyloxymethyl-2-norbornene, vinyl 2-norbornene-5-carboxylate, allyl 2-norbornene-5-carboxylate, 4-vinylphenyl 2-norbornene-5-carboxylate, vinyl 5-methyl-2-norbornene-5-carboxylate, allyl 5-methyl-2-norbornene-5-carboxylate, 4-vinylphenyl 5-methyl-2-norbornene-5-carboxylate, 5-norbornen-2-yl methacrylate, 5-norbornen-2-yl acrylate, 5-norbornen-2-ylmethyl methacrylate, 5-norbornen-2-ylmethyl acrylate, divinyl 2-norbornene-5,6-dicarbonxylate, diallyl 2-norbornene-5,6-dicarbonxylate, vinyl 6-methoxycarbonyl-2-norbornene-5-carboxylate, allyl 6-methoxycarbonyl-2-norbornene-5-carboxylate, vinyl 6-ethoxycarbonyl-2-norbornene-5-carboxylate, allyl 6-ethoxycarbonyl-2-norbornene-5-carboxylate, 2-acryloxyethyl 2-norbornene-5-carboxylate, 2-methacryloxyethyl 2-norbornene-5-carboxylate, 5-norbornen-2-ylmethyl 2-(2-propenoxycarbonyl)benzoate, 2,2-di(acryloxymethyl)pentan-4-yl 2-norbornene-5-carboxylate, 2,2-di(methacryloxymethyl)pentan-4-yl 5-methyl-2-norbornene-5-carboxylate and 7-oxa-5-norbornen-2-yl methacrylate;

tricycloolefin compounds such as N-(4-vinylphenyl)-2-norbornene-5,6-dicarboxyimide, N-allyl-2-norbornene-5,6-dicarboxyimide, 9-vinyltricyclo[6.2.1.0$^{2,7}$]undec-4-ene and 4-vinyltricyclo[6.2.1.0$^{2,7}$]undec-9-ene; and tetracycloolefin compounds such as 9-vinyl-4-tetracyclododecene, 9-(2-propenyl)-4-tetracyclododecene, vinyl 4-tetracyclododecene-9-carboxylate, allyl 4-tetracyclododecene-9-carboxylate and diallyl 4-tetracyclododecene-9,10-dicarboxylate.

The cycloolefin mixture may contain other cycloolefin than the specific cycloolefin. As the cycloolefin other than the specific cycloolefin, a cycloolefin monomer having no monovalent group including an aliphatic carbon-carbon unsaturated bond (the norbornene monomer and the monocycloolefin monomer) can be used together with the specific cycloolefin.

Examples of the norbornene monomer include norbornenes, dicyclopentadienes, tetracyclododecenes and penta- or more-cycloolefins. The norbornene monomer may have a hydrocarbon group such as methyl group or a polar group such as carboxyl group.

Specific examples of norbornenes include bicyclo[2.2.1]hept-2-ene (hereinafter referred to as 2-norbornene), 5-methyl-2-norbornene, 5-ethyl-2-norbornene, 5-butyl-2-norbornene, 5-hexyl-2-norbornene, 5-decyl-2-norbornene, 5-cyclohexyl-2-norbornene, 5-cyclopentyl-2-norbornene, 5-ethylidene-2-norbornene, 5-cyclohexenyl-2-norbornene, 5-cyclopentenyl-2-norbornene, 5-phenyl-2-norbornene, tetracyclo[9.2.1.0$^{2,10}$.0$^{3,8}$]tetradeca-3,5,7,12-tetraene (also referred to as 1,4-methano-1,4,4a,9a-tetrahydro-9H-fluorene), tetracyclo[10.2.1.0$^{2,11}$.0$^{4,9}$]pentadeca-4,6,8,13-tetraene (also referred to as 1,4-methano-1,4,4a,9,9a,10-hexahydroanthracene), methyl 2-norbornene-5-carboxylate, ethyl 2-norbornene-5-carboxylate, methyl 5-methyl-2-norbornene-5-carboxylate, ethyl 5-methyl-2-norbornene-5-carboxylate, 5-norbornen-2-yl acetate, 2-methyl-5-norbornen-2-yl acetate, 5-norbornen-2-yl acrylate, 2-norbornene-5-carboxylic acid, 2-norbornene-5,6-dicarboxylic acid, 2-norbornene-5,6-dicarboxylic anhydride, 2-norbornene-5-methanol, 2-norbornene-5,6-dimethanol, 2-norbornen-5-ol, 2-norbornene-5-carbonitrile, 2-norbornene-5-carbaldehyde, 2-norbornene-5-carboxamide, 5-acetyl-2-norbornene, 6-methoxycarbonyl-2-norbornene-5-carboxylic acid, 2-norbornene-5,6-dicarboxyimide, 7-oxa-2-norbornene, 5-methyl-7-oxa-2-norbornene, 5-ethyl-7-oxa-2-norbornene, 5-butyl-7-oxa-2-norbornene, 5-hexyl-7-oxa-2-norbornene, 5-cyclohexyl-7-oxa-2-norbornene, 5-ethylidene-7-oxa-2-norbornene, 5-phenyl-7-oxa-2-norbornene, methyl 7-oxa-2-norbornene-5-carboxylate and 7-oxa-5-norbornen-2-yl acetate.

Specific examples of dicyclopentadienes include dicyclopentadiene, methyldicyclopentadiene, dihydrodicyclopentadiene(tricyclo[5.2.1.0$^{2,6}$]dec-8-ene) and the like.

Specific examples of tetracyclododecenes include tetracyclo[6.2.1.1$^{3,6}$.0$^{2,7}$]dodec-4-ene (hereinafter referred to as 4-tetracyclododecene), 9-methyl-4-tetracyclododecene, 9-ethyl-4-tetracyclododecene, 9-cyclohexyl-4-tetracyclododecene, 9-cyclopentyl-4-tetracyclododecene, 9-methylene-4-tetracyclododecene, 9-ethylidene-4-tetracyclododecene, 9-cyclohexenyl-4-tetracyclododecene, 9-cyclopentenyl-4-tetracyclododecene, 9-phenyl-4-tetracyclododecene, methyl 4-tetracyclododecene-9-carboxylate, methyl 9-methyl-4-tetracyclododecene-9-carboxylate, 4-tetracyclododecene-9-methanol, 4-tetracyclododecen-9-ol, 4-tetracyclododecene-9-carboxylic acid, 4-tetracyclododecene-8,9-dicarboxyic acid, 4-tetracyclododecene-8,9-dicarboxylic anhydride, 4-tetracyclododecene-9-carbonitrile, 4-tetracyclododecene-9-carbaldehyde, 4-tetracyclododecene-9-caboxamide, 4-tetracyclododecene-8,9-dicarboxyimide, 9-chloro-4-tetracyclododecene, 9-trimethoxysilyl-4-tetracyclododecene and 9-acetyl-4-tetracyclododecene.

Specific examples of penta- or more-cycloolefins include pentacyclo[6.5.1.1$^{3,6}$.0$^{2,7}$.0$^{9,13}$]pentadeca-4,10-diene, pentacyclo[9.2.1.1$^{4,7}$.0$^{2,10}$.0$^{3,8}$]pentadeca-5,12-diene and hexacyclo[6.6.1.1$^{3,6}$.1$^{10,13}$.0$^{2,7}$.0$^{9,14}$]heptadec-4-ene.

These norbornene monomers can be used as one kind alone, but also used as two or more kinds together. By using two or more kinds of them together and varying the blending ratio, it is possible to control a glass transition temperature and a melting point of the formed object to be obtained.

Examples of the monocycloolefin monomer include cyclobutene, cyclopentene, cyclooctene, cyclododecene, 1,5-cyclooctadiene, and derivatives thereof each having a polar group such as a carboxyl group.

When the monocycloolefin monomer is used, the cycloolefin mixture contains the monocycloolefin monomer preferably 40% by weight or less and more preferably 20% by weight or less. When the amount of the monocycloolefin monomer is too large, the polymer obtained by ring-opening polymerization tends to be not in the state of a resin, but in the state of an elastomer.

The metathesis polymerization catalyst used in this invention is not particularly limited insofar as it enables the ring-opening metathesis polymerization of the cycloolefin monomer. An example of the metathesis polymerization catalyst is a complex having a transition metal atom as a central atom to which a plurality of ions, atoms, multi-atom ions and/or compounds are bonded. Examples of the transition metal atoms include: atoms of groups 5, 6 and 8 of a periodic table (long periodic-type, which also applies in later description). The atom in respective groups is not particularly limited, and the examples thereof are tantalum in Group 5, molybdenum or tungsten in Group 6 and ruthenium or osmium in Group 8.

Among them, preferable is the complex of ruthenium or osmium in group 8 and, for the following reason, more preferable is a ruthenium carbene complex in which a carbene is coordinated to a ruthenium atom. The ruthenium carbene complex is excellent in catalytic activity, thus makes the reaction conversion of ring-opening polymerization high, and therefore is excellent in productivity of the resin formed object. Besides, the resin formed object to be obtained is less smelly (originating from unreacted cyclic olefin). Further, the ruthenium carbene complex is relatively stable to oxygen and water in air and hardly inactivated.

The ruthenium complex catalyst can be produced by methods described in, for example, Organic Letters., vol. 1, p. 953 (1999) and Tetrahedron Letters., vol. 40, p. 2247 (1999).

Examples of the ruthenium carbene complex include ruthenium complex compounds in which a heteroatom-containing carbene compound and a neutral electron-donating compound are bonded to a ruthenium atom, such as benzylidene (1,3-dimesitylimidazolidin-2-ylidene) (tricyclohexyl phosphine) ruthenium dichloride, (1,3-dimesityl-imidazolidin-2-ylidene) (3-methyl-2-buten-1-ylidene) (tricyclopentyl phosphine) ruthenium dichloride, benzylidene (1,3-dimesityl-octahydrobenzimidazol-2-ylidene) (tricyclohexyl phosphine) ruthenium dichloride, benzylidene (1,3-di(1-phenylethyl)-4-imidazolin-2-ylidene) (tricyclohexyl phosphine) ruthenium dichloride, benzylidene (1,3-dimesityl-2,3-dihydrobenzimidazol-2-ylidene) (tricyclohexyl phosphine) ruthenium dichloride, benzylidene (tricyclohexyl phosphine) (1,3,4-triphenyl-2,3,4,5-tetrahydro-1H-1,2,4-triazol-5-ylidene) ruthenium dichloride, (1,3-diisopropylhexahydropyrimidin-2-ylidene) (ethoxymethylene) (tricyclohexyl phosphine) ruthenium dichloride, and benzylidene (1,3-dimesitylimidazolidin-2-ylidene) pyridine ruthenium dichloride;

ruthenium complex compounds in which two heteroatom-containing carbene compounds are bonded to a ruthenium atom, such as benzylidenebis(1,3-dicyclohexylimidazolidin-2-ylidene) ruthenium dichloride and benzylidenebis(1,3-diisopropyl-4-imidazolin-2-ylidene) ruthenium dichloride; and other ruthenium compounds such as (1,3-dimesitylimidazolidin-2-ylidene) (phenylvinylidene) (tricyclohexyl phosphine) ruthenium dichloride, (t-butylvinylidene) (1,3-diisopropyl-4-imidazolin-2-ylidene) (tricyclopentyl phosphine) ruthenium dichloride, and bis(1,3-dicyclohexyl-4-imidazolin-2-ylidene)phenyl vinylidene ruthenium dichloride.

The amount of the metathesis polymerization catalyst, in terms of the molar ratio of (transition metal atom in the catalyst cycloolefin mixture), is usually in the range of 1:2,000 to 1:2,000,000, preferably 1:5,000 to 1:1,000,000, more preferably 1:10,000 to 1:500,000.

The radical generating agent used in this invention is a compound which generates a radical by heating and has effect on crosslinking the cycloolefin polymer with the radical. The site where the radical generating agent causes the crosslinking reaction is mainly a carbon-carbon double bond in the resin constituting the resin formed object, but in some case, crosslinking is caused in a saturated bond portion in the resin.

Examples of the radical generating agent include an organic peroxide and a diazo compound. Examples of the organic peroxide include hydroperoxides such as t-butyl hydroperoxide, p-menthane hydroperoxide and cumene hydroperoxide; dialkyl peroxides such as dicumyl peroxide and t-butyl cumyl peroxide; diacyl peroxides such as dipropionyl peroxide and benzoyl peroxide; peroxyketals such as 2,5-dimethyl-2,5-di(t-butylperoxy)hexane, 2,5-dimethyl-2,5-di(t-butylperoxy)hexine-3 and 1,3-di(t-butylperoxyisopropyl)benzene; peroxyesters such as t-butylperoxyacetate and t-butylperoxybenzoate; peroxycarbonates such as t-butylperoxyisopropyl carbonate and di(isopropylperoxy) dicarbonate; and alkylsilyl peroxides such as t-butyl trimethylsilyl peroxide. Among them, preferably are dialkyl peroxides since the hindrance against the metathesis polymerization reaction in the bulk polymerization is lower.

Examples of the diazo compound include 4,4'-bisazidobenzal(4-methyl)cyclohexanone, 4,4'-diazidochalcone, 2,6-bis(4'-azidobenzal)cyclohexanone, 2,6-bis(4'-azidobenzal)-4-methylcyclohexanone, 4,4'-diazidophenylsulfon, 4,4'-diazidodiphenylmethane and 2,2'-diazidostilbene.

The amount of the radical generating agent is usually in the range of 0.1 to 10 parts by weight and preferably 0.5 to 5 parts by weight per 100 parts by weight of the cycloolefin mixture. When the amount of the radical generating agent is too small, crosslinking may be insufficient and the crosslinked resin formed object with a high crosslinking density may not be obtained. To the contrary, when the amount of the radical generating agent is too large, the crosslinking effect is saturated and thus the crosslinked resin formed object with a desired physical properties may not be obtained.

Various kinds of additives can be if necessary incorporated into the polymerizable composition of this invention in the range where the additive does not hinder the effect of this invention. Examples thereof include a chain transfer agent, an activator (cocatalyst), a polymerization retarder, a crosslinking assistant, a filler, a solvent, a modifier, an antioxidant, a flame retardant, a colorant, a light stabilizer and the like.

By adding the chain transfer agent into the polymerizable composition of this invention, the progress of the crosslinking reaction due to the heat generated in ring-opening polymerization can be prevented. The resin formed object obtained by ring-opening polymerization of the polymerizable composition containing the chain transfer agent comes to molten-state by heating at a high temperature, and when the temperature thereof reaches to the temperature higher than the maximum temperature (peak temperature) during the ring-opening polymerization, the crosslinking reaction gets to progress therein to provide the crosslinked resin formed object.

When the resin formed object is laminated with a base material such as a metal foil and thereafter the laminate is heated, the molten-state resin formed object deforms in accordance with the shape of the base material, and therefore the adherence in the interface therebetween improves remarkably.

Specific examples the chain transfer agent include aliphatic olefins such as 1-hexene and 2-hexene; aromatic olefins such as styrene, vinylstyrene, stilbene, vinylbenzene and divinylbenzene; vinyl alicyclic compounds such as vinylcyclohexane; vinyl ethers such as ethyl vinyl ether and allyl glycidyl ether; vinyl ketones such as methyl vinyl ketones; ethylenically unsaturated esters such as allyl acetate and allyl methacrylate; alcoxy silanes such as vinyl trimethoxy silane, allyl trimethoxy silane and p-styryl trimethoxy silane; hydrocarbon chain transfer agents each having two or more vinyl groups such as 1,4-pentadiene, 1,5-hexadiene, 1,6-heptadiene, 3,3-dimethyl-1,4-pentadiene, 3,5-dimethyl-1,6-heptadiene, 3,5-dimethoxy-1,6-heptadiene, 1,2-divinylcyclohexane, 1,3-divinylcyclohexane, 1,4-divinylcyclohexane, 1,2-divinylbenzene, 1,3-divinylbenzene, 1,4-divinylbenzene, divinyl cyclopentane, diallyl benzene, divinyl naphthalene, divinyl anthracene, divinyl phenanthrene, trivinylbenzene, and polybutadiene (including 1,2-addition ratio 10% or more); and heteroatom-containing chain transfer agents each having two or more vinyl groups such as diallyl ether, 1,5-hexadien-3-on, diallyl maleate, diallyl oxalate, diallyl malonate, diallyl succinate, diallylglutarate, diallyladipate, diallylphthalate, diallyl fumalate, diallyl terephthalate, triallyl cyanurate, triallyl isocianurate, divinyl ether, allyl vinyl ether, divinyl maleate, divinyl oxalate, divinyl malonate, divinyl succinate, divinyl glutarate, divinyl adipate, divinyl phthalate, divinyl fumalate, divinyl terephthalate, trivinyl cyanurate and trivinyl isocyanurate. The amount of the chain transfer agent is usually in the range of 0.01 to 10 parts by weight, preferably 0.05 to 5 parts by weight, and more preferably 0.1 to 2 parts by weight per 100 parts by weight of the cycloolefin mixture. When the amount of the chain transfer agent is in the range, the resin formed object excellent in fluidity can be obtained since the crosslinking reaction during the ring-opening polymerization is sufficiently suppressed.

Among the hydrocarbon chain transfer agents each having two or more vinyl groups in the molecule, when the hydrocarbon chain transfer agent having no heteroatom such as oxygen, nitrogen, or sulfur in the molecule is used, the crosslinked resin formed object or the crosslinked resin composite of this invention acquires the low electric characteristics such as specific inductive capacity and dielectric loss tangent and therefore is preferably used as an electric insulating material for a high frequency signal. Other chain transfer agent other than the above compound having two or more vinyl groups in the molecule can be used together therewith. Example of the other chain transfer agent is a compound having only one vinyl group. The amount of the chain transfer agent having only one vinyl group in the molecule is usually 50% by mole or less, preferably 40% by mole or less, more preferably 30% by mole or less and especially preferably 10% by mole or less per the amount of the chain transfer agent having two or more vinyl groups in the molecule.

The activator (cocatalyst) or the polymerization retarder can be added into the polymerizable composition for the purpose of controlling the polymerization activity of the metathesis polymerization catalyst or improving the polymerization reaction conversion. The activator can be exemplified by (partial) alkylation products, (partial) halogenation products, (partial) alkoxylation products and (partial) aryloxylation products of aluminum, scandium, tin, titanium, and zirconium Specific examples of the activator include trialkoxy aluminum, triphenoxy aluminum, dialkoxyalkyl aluminum, alkoxydialkyl aluminum, trialkyl aluminum, dialkoxy aluminum chloride, alkoxyalkyl aluminum chloride, dialkyl aluminum chloride, trialkoxyscandium, tetraalkoxy titanium, tetraalkoxy tin, and tetraalkoxy zirconium.

Examples of the polymerization retarder include acyclic diene compounds such as 1,5-hexadiene, 2,5-dimethyl-1,5-hexadiene, (cis,cis)-2,6-octadiene (cis,trans)-2,6-octadiene and (trans,trans)-2,6-octadiene; acyclic triene compounds such as (trans)-1,3,5-hexatriene, (cis)-1,3,5-hexatriene, (trans)-2,5-dimethyl-1,3,5-hexatriene and (cis)-2,5-dimethyl-1,3,5-hexatriene; phosphines such as triphenylphosphine, tri-n-butylphosphine and methyldiphenylphosphine; and Lewis bases such as aniline.

A cycloolefin having a diene structure or a triene structure in the ring can be used as the polymerization retarder. Examples of the cycloolefin include monocycloolefins such as 1,5-cyclooctadiene, 1,5-dimethyl-1,5-cyclooctadiene, 1,3,5-cycloheptatriene and (cis,trans,trans)-1,5,9-cyclododecatriene. Since the cycloolefin having a diene structure or a triene structure in the ring is the polymerization retarder and at the same time the cycloolefin, the cycloolefin can be used as part of the cycloolefin mixture.

The amount of the activator or the polymerization retarder can be set arbitrarily depending on the used compound and the object, and usually in the range of 1:0.05 to 1:100, preferably 1:0.2 to 1:20 and more preferably 1:0.5 to 1:10, in terms of the molar ratio of (transition metal atom in the metathesis polymerization catalyst:the activator or the polymerization retarder).

The crosslinking assistant can be added into the polymerizable composition for the purpose of improving the crosslinking reaction rate. Examples of the crosslinking assistant include dioxime compounds such as p-quinone dioxime; methacrylate compounds such as lauryl methacrylate and trimethylolpropane trimethacrylate; fumaric acid compounds such as diallyl fumarate; phthalic acid compounds such as diallyl phthalate; cyanuric acid compounds such as tryallyl cyanurate; and imide compounds such as maleimide. The amount of the crosslinking assistant is not particularly limited, but is usually in the range of 0 to 100 parts by weight and preferably 0 to 50 parts by weight per 100 parts by weight of the cycloolefin mixture.

The filler can be added into the polymerizable composition for the purpose of reducing linear expansion coefficient, improving mechanical strength such as elastic modulus, increasing dielectric constant, decreasing dielectric loss tangent and decreasing the degree of shrinkage on curing of the resin formed object, the crosslinked resin formed object and the crosslinked resin composite obtained by ring-opening polymerization of the polymerizable composition.

The filler is preferably in a particulate form. The average particle diameter determined by measuring the lengths of the major axes of 1000 filler particles under a scanning electron microscope is preferably in the range of 0.001 to 100 μm, more preferably 0.01 to 50 μm, still more preferably 0.1 to 20 μm.

The filler may be an inorganic filler or an organic filler, and in order to achieve the above object, the inorganic filler is preferable. Examples of the inorganic filler include hydroxides such as aluminum hydroxide, magnesium hydroxide and calcium hydroxide; oxides such as silicon oxide (silica), aluminum oxide and zinc oxide; chlorides such as sodium chloride and calcium chloride; sulfates such as sodium hydrogen sulfate and sodium sulfate; nitrates such as sodium nitrate and calcium nitrate; phosphates such as sodium dihydrogen phosphate and sodium hydrogen phosphate; silicates such as mica, kaolin, fly ash and talc; titanates such as barium titanate and calcium titanate; carbides such as silicon carbide and boron carbide; nitrides such as aluminum nitride, boron nitride and silicon nitride; glass powder; carbon black; particles of metals such as aluminum, nickel, magnesium, copper, zinc and iron; ferrites such as Mn—Mg—Zn ferrite, Ni—Zn ferrite and Mn—Zn ferrite; powder of ferromagnetic metals such as carbonyl iron, iron-silicon alloy, iron-aluminum-silicon alloy and iron-nickel alloy. Among the above fillers, preferable are hydroxides, oxides, titanates and carbonates, and more preferable are aluminum hydroxide and magnesium hydroxide among the hydroxides, silicon oxide (silica) among the oxides, barium titanate and calcium titanate among the titanates, and calcium carbonate among the carbonates.

These fillers treated surface thereof with a silane coupling agent, a titanate coupling agent, an aluminum coupling agent or the like can also be used.

The amount of the filler is usually in the range of 1 to 1,000 parts by weight, preferably 100 to 900 parts by weight, more preferably 200 to 800 parts by weight, and especially preferably 300 to 700 parts by weight per 100 parts by weight of the cycloolefin mixture. When the amount of the filler is too small, the purpose of reducing linear expansion coefficient and improving mechanical strength of the resin formed object can not be completed sufficiently, while when the amount of the filler is too large, mechanical strength of the resin formed object may lower.

By adding the radical crosslinking retarder in the polymerizable composition, fluidity and storage stability of the resin formed object can be improved, which is preferable.

Examples of the radical crosslinking retarder include hydroxyanisoles such as 3-t-butyl-4-hydroxyanisole, 2-t-butyl-4-hydroxyanisole, 3,5-di-t-butyl-4-hydroxyanisole, 2,5-di-t-butyl-4-hydroxyanisole, bis-1,2-(3,5-di-t-butyl-4-hydroxyphenoxy)ethane; dialkoxyphenols such as 2,6-dimethoxy-4-methylphenol and 2,4-dimethoxy-6-t-butylphenol; catechols such as catechol, 4-t-butyl catechol and 3,5-di-t-butyl catechol; and benzoquinones such as benzoquinone, naphthoquinone and methylbenzoquinone. Among them, hydroxyanisoles, catechols and benzoquinones are preferable and hydroxyanisoles are more preferable.

The amount the radical crosslinking retarder contained is usually in the range of 0.001 to 1 mole and preferably 0.01 to 1 mole per one mole of the radical generating agent.

A small amount of the solvent is used to dissolve the metathesis polymerization catalyst or the radical generating agent if necessary. Also, the solvent can be used as the medium in solution polymerization of the polymerizable composition. In both cases, the solvent should be inert to the catalyst. Examples of the solvent include acylic aliphatic hydrocarbons such as n-pentane, n-hexane and n-heptane; alicyclic hydrocarbons such as cyclopentane, cyclohexane, methyl cyclohexane, dimethyl cyclohexane, hexahydroindene and cyclooctane; aromatic hydrocarbons such as benzene, toluene and xylene; nitrogen-containing hydrocarbons such as nitromethane, nitrobenzene and acetonitrile; and oxygen-containing hydrocarbons such as diethyl ether and tetrahydrofuran. Among them, preferable are aromatic hydrocarbons, acyclic aliphatic hydrocarbons and alicyclic hydrocarbons, which are excellent in dissolubility of the catalyst and generally used in industries. Further, a liquid antioxidant, a liquid plasticizer or a liquid modifier may be used as the solvent as far as it dose not degrade the activity of the metathesis polymerization catalyst.

Examples of the modifier include elastomers such as natural rubber, polybutadiene, polyisoprene, styrene-butadiene copolymer, styrene-butadiene-styrene block copolymer, styrene-isoprene-styrene copolymer, acrylonitrile-butadiene-styrene copolymer, acrylonitrile-butadiene copolymer, ethylene-propylene-diene terpolymer, ethylene-vinyl acetate copolymer, polysufide synthetic rubber, acrylic rubber, urethane rubber, fluororubber, silicone rubber, polyester elastomer, polyolefin thermoplastic elastomer and polyvinyl chloride thermoplastic elastomer.

Examples of the antioxidant include various kinds of antioxidants for plastics and rubbers such as a phenol type, a phosphorus type, an amine type and the like. These antioxidants may be used either alone or in combination of two or more kinds.

The polymerizable composition of this invention is obtained by mixing the cycloolefin mixture containing 0.1 to 50% by mole of the cycloolefin having, as the substituent group, the monovalent group including an aliphatic carbon-carbon unsaturated bond, the metathesis polymerization catalyst and the radical generating agent, and preferably the chain transfer agent, and if necessary the above additives. The apparatus, means and procedure for mixing the polymerizable composition are not particularly limited.

The resin formed object of this invention is obtained by ring-opening polymerization of the polymerizable composition described above. Ring-opening polymerization of the polymerizable composition may be conducted by a bulk polymerization method or a solution polymerization method and preferably conducted by a bulk polymerization method.

The method for obtaining the resin formed object by ring-opening polymerization of the polymerizable composition of this invention is not particularly limited, but there are, for example, (a) a method of applying the polymerizable composition onto a supporting body and conducting ring-opening polymerization, (b) a method of injecting the polymerizable composition into a cavity of a forming mold and conducting ring-opening polymerization, and (c) a method of impregnating a fiber reinforcement with the polymerizable composition and conducting ring-opening polymerization.

Since the polymerizable composition of this invention is low in viscosity, coating in the method (a) can be smoothly performed, injection in the method (b) can be quickly performed throughout the cavity without bubble inclusion even if the cavity has a complicated shape, and in the method (c) the polymerizable composition can be impregnated into the fiber reinforcement quickly and uniformly.

According to the method (a), a resin formed object in the shape of a film, a plate or the like can be obtained. The thickness of the resin formed object is not particularly limited, but is usually 15 mm or less, preferably 10 mm or less and more preferably 5 mm or less.

Examples of the supporting body include films or plates made of resins such as polyethylene terephthalate, polypropylene, polyethylene, polycarbonate, polyethylene naphthalate, polyallylate and Nylon; films or plates made of metal materials such as iron, stainless steel, copper, aluminum, nickel, chromium, gold and silver. Among them, preferable is metal foils or resin films. The thickness of the metal foil or the resin film is usually in the range of 1 to 150 µm, preferably 2 to 100 µm, and more preferably 3 to 75 µm from the viewpoint of workability.

Example of the method for applying the polymerizable composition of this invention onto the supporting body include known coating methods such as a spray coating method, a dip coating method, a roll coating method, a curtain coating method, a die coating method, and a slit coating method.

The polymerizable composition coated on the supporting body is dried if necessary and then ring-opening polymerization is conducted. The polymerizable composition is heated to conduct ring-opening polymerization. Examples of the method for heating the polymerizable composition include a method for heating the supporting body placed on a heating plate, a method for heating under a pressure (heat pressing) using a press machine, a method for pressing by using a heated roller, and a method using a heating furnace.

The shape of the resin formed object obtained by the method (b) can be set by the shape of the forming mold, and examples thereof include a film, a column, and any other three-dimensional shapes.

The shape, material and size of the forming mold are not particularly limited. Such forming mold includes, for example, conventional known molds such as a split mold, that is, a mold having a core mold and a cavity mold; and a mold in which spacers are provided between two plates.

The charging pressure (injection pressure) at which the cavity is charged with the polymerizable composition of this invention is usually 0.01 to 10 MPa, preferably 0.02 to 5 MPa. When the charging pressure is too low, the injection thereof is insufficient and thus a transfer face formed on the inner periphery of the cavity tends to be not excellently transferred, while when the charging pressure is too high, the rigidity of the mold should be higher, which is not economical. The clamping pressure is usually in the range of 0.01 to 10 MPa.

By heating the polymerizable composition injected in the cavity, ring-opening polymerization can be conducted. Examples of the method for heating the polymerizable composition include a method using a heating means such as an electric heater or steam attached to the forming mold, and a method for heating the forming mold in a electric furnace.

As the resin formed object obtained by the method (c), for example, a prepreg in which the ring-opening polymer is filled into the gap of a fiber reinforcement can be cited. As the fiber reinforcement, a fiber made of organic and/or inorganic material can be used and examples thereof include known fibers such as a glass fiber, a metal fiber, a ceramic fiber, a carbon fiber, an aramid fiber, a polyethylene terephthalate fiber, a vinylon fiber, a polyester fiber, and an amide fiber. These can be used either alone or in combination of two or more. Examples of the shape of the fiber reinforcement include a mat, a cloth and a nonwoven fabric.

An example of the method for impregnating the fiber reinforcement with the polymerizable composition of this invention is a method in which a predetermined amount of the polymerizable composition is poured over the fiber reinforcement such as a cloth or a mat, a protective film is if necessary laminated on the wet coated fiber reinforcement, and pressing the wet coated fiber reinforcement using a roller from the upper side. After impregnating the fiber reinforcement with the polymerizable composition, the impregnated product is heated at a predetermined temperature to conduct bulk polymerization to obtain the fiber reinforced formed object in which the polymer is impregnated. Examples of the method for heating the impregnated product are a method of setting the impregnated product on the supporting body and heating as the same manner in the method (a); and a method of setting the fiber reinforcement in the forming mold, then impregnating the fiber reinforcement with the polymerizable composition, and heating as the same manner in the method (b).

In any of the methods (a), (b) and (c), the heating temperature (in the method (b), metal mold temperature) for ring-opening polymerization of the polymerizable composition is usually in the range of 30 to 250° C. and preferably 50 to 200° C. The polymerization time can be properly set, and is usually in the range of 10 seconds to 20 minutes and preferably 30 seconds to 5 minutes.

The polymerizable composition is heated at the predetermined temperature to thereby start the bulk polymerization reaction. When the bulk polymerization reaction is started, the temperature of the polymerizable composition rapidly rises by reaction heat and reaches a peak temperature in a short time (for example, 10 seconds to 5 minutes). Although the polymerization reaction keeps on advancing for a while, the polymerization reaction is gradually settled, and the temperature thereof goes down. It is preferable to set the peak temperature on the temperature equal to or higher than the glass transition temperature of the resin constituting the resin formed object obtained by the polymerization reaction since the polymerization reaction progresses completely. The peak temperature can be controlled by the heating temperature. When the resin formed object is obtained by polymerizing the polymerizable composition containing the chain transfer agent, the polymerization reaction conversion of the resin formed object is usually 80% or more, preferably 90% or more and more preferably 95% or more. The polymerization reaction conversion of the resin formed object can be determined, for example, by analyzing a solution that is prepared by dissolving the resin formed object in a solvent with a gas chromatography. The resin formed object in which polymerization has been almost completely progressed is less in residual monomer and almost free of a smell originating from the residual monomer.

When the peak temperature during the ring-opening polymerization is too high, not only ring-opening polymerization but also crosslinking reaction may progress. Therefore, in order to progress only ring-opening polymerization reaction completely without progressing crosslinking reaction, it is required to control the peak temperature during the ring-opening bulk polymerization to be preferably lower than 200° C.

In this case, the peak temperature during the ring-opening polymerization is preferably equal to or lower than one minute half-life temperature of the radical generating agent.

Herein, the term "one minute half-life temperature" means the temperature at which half of the original amount of the radical generating agent decomposes in one minute. For example, in a case of di-t-butyl peroxide, the temperature is 186° C. and in a case of 2,5-dimethyl-2,5-di(t-butylperoxy)-hexine-3, the temperature is 194° C.

A crosslinked resin formed object of this invention can be obtained by heating the resin formed object described above. The temperature for heating and crosslinking the resin formed object is usually in the range of 170 to 250° C. and preferably 180 to 220° C. This temperature is preferably higher than the peak temperature during the ring-opening polymerization and is more preferably higher than the peak temperature thereof by 20° C. or more. The time for heating and crosslinking the resin formed object is not particularly limited, but is usually in the range of several minutes to several hours.

The method for heating and crosslinking the resin formed object of this invention is not particularly limited. When the resin formed object is in the shape of a film, preferably adopted is a method of laminating a plural resin formed objects if necessary and heating the resin formed object(s) by heat press. The pressure of heat press is usually in the range of 0.5 to 20 MPa and preferably 3 to 10 MPa.

A crosslinked resin composite of this invention is obtained by laminating the resin formed object of this invention with a base material and heating the laminate for crosslinking.

Examples of the base material include metal foils such as a copper foil, an aluminum foil, a nickel foil, a chromium foil, a gold foil and a silver foil; substrates for printed wiring board; and resin films such as a polytetrafluoroethylene (PTFE) film, a conductive polymer film. The surface of the base film may also treated with a silane coupling agent, a thiol coupling agent, a titanate coupling agent, various kinds of adhesives or the like. When the resin formed object is manufactured by the above method (a), the supporting body as is may be used as the base material.

The crosslinked resin formed object of this invention can also be obtained using the polymerizable composition in a single step (without forming the resin formed object). In order to obtain the crosslinked resin formed object in a single step, it is required to set the temperature for ring-opening polymerization high and to heat the polymerizable composition to the temperature at which crosslinking reaction occurs. However, when the crosslinked resin composite is intended to be manufactured, it is preferable to produce the resin formed object once and thereafter produce the crosslinked resin composite because peel strength in the interface result in high. Besides, the crosslinked resin composite has an advantage of being manufactured in a very simple way since the step of vaporizing the solvent as is done in a conventional cast method is not necessary.

The heating method for manufacturing the crosslinked resin composite of this invention is not particularly limited, but preferable is a method of laminating the resin formed object with the base material such as the metal foil or the substrate for printed wiring board and then heat pressing the laminate, because the productivity thereof is high. The condition for heat pressing the laminate is the same as in producing the crosslinked resin formed object.

A metal foil clad laminate with a high adherence between the crosslinked resin and the metal foil can be obtained, for example, by laminating the resin formed object of this invention with the metal foil as the base material, and heating and crosslinking by heat pressing. The peel strength of the metal foil of the metal foil clad laminate obtained, when a copper foil is employed as the metal foil, is preferably 0.8 kN/m or more and more preferably 1.2 kN/m or more, which is measured based on JIS C 6481.

The crosslinked resin formed object and the crosslinked resin composite obtained by using the polymerizable composition or the resin formed object of this invention have the same characteristics such as a low linear expansion coefficient, a high mechanical strength and a low dielectric loss tangent and the like as the cycloolefin resin originally has, and further are excellent in heat resistance and adherence in comparison to the conventional cycloolefin resin.

The crosslinked resin formed object and the crosslinked resin composite of this invention with such features are preferably used as electronic part materials such as a prepreg, a resin laminated copper foil, a printed wiring board, an insulation sheet, an interlayer insulation film, an overcoat and an antenna substrate.

EXAMPLES

The present invention is specifically described by referring examples and comparative examples. Testing and evaluation in the examples and the comparative examples are conducted in the following ways:

(1) Weight-Average Molecular Weight (Mw)

A resin portion of the prepreg was dissolved into tetrahydrofuran and the weight-average molecular weight (Mw) in terms of polystyrene was measured with gel permeation chromatography (GPC) to obtain Mw of the polymer in the resin formed object.

(2) Glass Transition Temperature (Tg)

Glass transition temperature (° C.) was measured by using the sample obtained from the resin portion of the single sided copper clad laminate with differential scanning calorimeter based on JIS C 6481.

(3) Heat Resistance

Heat resistance was measured by floating a resin portion of the single sided copper clad laminate in a solder bath at 280° C. for 20 seconds according to JIS C 6481, and results were evaluated with the following criteria.

◯: no swell

Δ: slight swell

X: with a swell (4) Residual Ratio

Residual ratio was obtained by removing a copper foil of the single side copper clad laminate by etching with a ammonium persulfate aqueous solution, then cutting off the remaining plate into a disc with a diameter of 10 mm, then immersing the disc in toluene at 23° C. for 24 hours, then picking up the disc from the toluene, then drying the disc with a vacuum drier at 60° C. for 5 hr, and calculating the ratio (residual ratio) of the weight of the disc after drying relative to the weight of the disc before immersing in toluene. A crosslinked resin formed object with a high residual ratio means that it has a high crosslinking density.

Example 1

Put into a 30 ml glass bottle were 42 mg of 3,5-di-t-butylhydroxyanisole (antioxidant), 11.3 g (0.04 mole) of tetracyclo[6.2.1.1$^{3,6}$.0$^{2,7}$]dodec-4-ene, 3.7 g (0.004 mole) of 2-norbornene, 0.45 g of 5-vinyl-2-norbornene, 0.30 g of divinylbenzene (with a purity of 55%, a mixture of m- and p-divinylbenzenes, manufactured by Tokyo Kasei Kogyo Co., Ltd., including ethylbenzene and diethylbenzene as impurities) and 0.22 ml of di-t-butyl peroxide (one minute half-life temperature of 186° C.), and 0.06 ml of toluene solution of benzylidene (1,3-dimesitylimidazolidin-2-ylidene)(tricyclohexylphosphine)ruthenium dichloride with a concentration of 0.05 mol/l further was added into the glass bottle and the mixture was stirred to prepare a polymerizable composition.

Two sheets of glass cloths cut off each in size of 200 mm in length×200 mm in width, having a thickness of 0.174 mm (a trade No. 7628/AS891AW, manufactured by ASAHI-SHWEBEL CO., LTD.) were placed on a glass fiber reinforced PTFE resin film cut off in size of 300 mm in length and 300 mm in width, having a thickness of 0.08 mm (with a product No. 5310, manufactured by SAINT-GOBAIN KK), the polymerizable composition was poured over the glass cloths. Another sheet of glass fiber reinforced polytetrafluoroethylene resin film same as above was placed on the glass cloths, and the laminate was roller pressed to impregnate the glass cloths with the polymerizable composition.

The laminate in which the impregnating glass cloths were sandwiched between the glass fiber reinforced PTFE resin films was polymerized by adhering onto a hot plate heated at 145° C. for 1 minute. Thereafter, the two glass fiber reinforced PTFE resin films were both peeled off from the upper and lower surface of the laminate to obtain a prepreg, which was a resin formed object.

One drop of acetic acid was added into 60 g of distilled water in a glass vessel and further 0.18 g of styryltrimethoxysilane (KEM-1403, manufactured by Shin-Etsu Chemical Co., Ltd.) was added therein, and stirring the mixture for 1 hour for hydrolysis and dissolution to obtain a silane coupling agent solution. The silane coupling agent solution obtained was coated, by using an absorbent cotton, on a rough surface of an electrodeposited copper foil (a rough surface GTS treated product, manufactured by FURUKAWA CIRCUIT FOIL Co., Ltd.) with a thickness of 0.018 mm, and followed by drying in a nitrogen atmosphere at 130° C. for 1 hour.

Three sheets of samples each sheet was cut off in size of 87 mm in length×87 mm in width from the prepreg were laminated one another and sandwiched between the electrodeposited copper foil (the rough surface of which was in contact with the prepreg) and a PTFE film having a thickness of 0.05 mm. In this state the laminate was put into a mold in the shape of framed rectangle, in inner size of 90 mm in length and 90 mm in width and with a thickness of 1 mm, and the laminate was heat pressed in the mold frame under a press pressure of 4.1 MPa at 200° C. for 15 min. Thereafter, the laminate was cooled down while the press pressure was kept on, and the sample was taken off after the temperature thereof was at 100° C. or less to obtain a double sided copper clad laminate, which was a crosslinked resin composite.

In Table 1, there are shown a weight-average molecular weight (Mw) of the polymer in the prepreg, and the glass transition temperature (Tg) and evaluation results of heat resistance and the residual ratio of the crosslinked resin in the crosslinked resin formed object constituting the single side copper clad laminate.

Example 2

Example 2 was conducted in the same manner as in Example 1 with the exception that the amount of 5-vinyl-2-norbornene was changed to 0.75 g (0.0625 mol). The test same as in Example 1 was conducted, results of which are shown in Table 1.

Comparative Example 1

Comparative Example 1 was conducted in the same manner as in Example 1 with the exception that 5-vinyl-2-norbornene was not added. The test same as in Example 1 was conducted, results of which are shown in Table 1.

TABLE 1

| | Specific cycloolefin 5-vinyl-2-norbornene (mole %) | Prepreg Mw | Crosslinked resin complex material | | |
|---|---|---|---|---|---|
| | | | Tg (° C.) | Heat resistance | Residual ratio(%) |
| Example 1 | 3.3 | 30,500 | 112 | ○ | 91 |
| Example 2 | 4.7 | 29,600 | 109 | ○ | 94 |
| Comparative Example 1 | 0 | 29,800 | 114 | X | 85 |

As shown in Table 1, the crosslinked resin formed object constituting the single side copper clad laminate, which was the crosslinkable resin composite obtained using the polymerizable composition of this invention, was excellent in heat resistance. It is found that the crosslinked resin formed objects obtained are crosslinked products of the thermoplastic resin because each of them has the glass transition point. It is also found that the crosslinked resin formed objects obtained have a high crosslinking density because the residual ratios thereof are high (Examples 1 and 2).

On the other hand, the crosslinked resin formed object constituting the crosslinked resin composite and obtained by using the polymerizable composition into which the cycloolefin having, as a substituent group, a monovalent group including a carbon-carbon unsaturated bond (specific cycloolefin) was not added was poor in heat resistance. It is found that the crosslinked resin formed object is low in crosslinking density because the residual ratio thereof is high (Comparative Example 1).

The invention claimed is:
1. A polymerizable composition comprising:
  a cycloolefin mixture containing 0.1 to 50% by mole of a cycloolefin having, as a substituent group, a monovalent group including an aliphatic carbon-carbon unsaturated bond,
  a metathesis polymerization catalyst,
  a radical generating agent, and
  a chain transfer acent.
2. A resin formed object obtained by ring-opening polymerizing the polymerizable composition as claimed in claim 1.
3. A resin formed object obtained by applying the polymerizable composition as claimed in claim 1 on a supporting body, followed by ring-opening polymerizing the polymerizable composition applied.
4. A resin formed object obtained by injecting the polymerizable composition as chimed in claim 1 into a cavity of mold, followed by ring-opening polymerizing the polymerizable composition injected.
5. A resin formed object obtained by impregnating a fiber reinforcement with the polymerizable composition as claimed in claim 1, followed by ring-opening polymerizing the polymerizable composition impregnated.

6. A crosslinked resin formed object obtained by heating and crosslinking the resin formed object as claimed in claim 2 to the temperature higher than the peak temperature during the ring-opening polymerization.

7. A crosslinked resin composite obtained by laminating the resin formed object as claimed in claim 2 with a base material, followed by heating and crosslinking the laminate.

8. A polymerizable composition comprising:
a cycloolefin mixture containing 0.1 to 50% by mole of a cycloolefin having, as a substituent group, a monovalent group including an aliphatic carbon-carbon unsaturated bond at the terminal of the monovalent group,
a metathesis polymerization catalyst,
a radical generating agent, and
a chain transfer agent.

9. The polymerizable composition according to claim 8, wherein the monovalent group is at least one selected from the group consisting of vinyl group, allyl group, acryloyl group, methacryloyl group, vinyloxy group, allyloxy group, vinyloxycarbonyl group, allyloxycarbonyl group, acryloxymethyl group, methacryloxymethyl group, vinylphenyl group and 2-propenoxycarbonylphenyloxycarbonyl group.

10. The polymerizable composition according to claim 8, wherein the monovalent group is at least one selected from the group consisting of vinyl group and allyl group.

* * * * *